United States Patent
Nitta et al.

(10) Patent No.: US 6,518,144 B2
(45) Date of Patent: Feb. 11, 2003

(54) SEMICONDUCTOR DEVICE HAVING TRENCHES AND PROCESS FOR SAME

(75) Inventors: Tetsuya Nitta, Hyogo (JP); Tadaharu Minato, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 15 days.

(21) Appl. No.: 09/813,791

(22) Filed: Mar. 22, 2001

(65) Prior Publication Data

US 2002/0040994 A1 Apr. 11, 2002

(30) Foreign Application Priority Data

Oct. 10, 2000 (JP) ......................... 2000-309022

(51) Int. Cl.$^7$ ................. H01L 21/76; H01L 21/311
(52) U.S. Cl. .................. 438/424; 438/425; 438/431; 438/437; 438/435; 438/700; 438/701; 148/DIG. 50
(58) Field of Search .................. 438/700, 701, 438/435, 424, 425, 431, 437; 148/DIG. 50

(56) References Cited

U.S. PATENT DOCUMENTS

| | | | | |
|---|---|---|---|---|
| 5,451,804 A | * | 9/1995 | Lur et al. | 257/330 |
| 5,665,635 A | * | 9/1997 | Kwon et al. | 438/427 |
| 5,795,811 A | * | 8/1998 | Kim et al. | 438/404 |
| 5,897,361 A | * | 4/1999 | Egawa | 148/DIG. 50 |
| 6,040,600 A | | 3/2000 | Uenishi et al. | |
| 6,074,927 A | * | 6/2000 | Kepler et al. | 438/400 |
| 6,096,622 A | * | 8/2000 | Kim et al. | 438/424 |
| 6,127,244 A | * | 10/2000 | Lee | 438/455 |
| 6,140,691 A | * | 10/2000 | Gardner et al. | 257/396 |
| 6,306,723 B1 | * | 10/2001 | Chen et al. | 438/429 |
| 6,335,550 B1 | * | 1/2002 | Miyoshi et al. | 257/288 |

FOREIGN PATENT DOCUMENTS

| | | |
|---|---|---|
| JP | 57-113253 | 7/1982 |
| JP | 6-181255 | 6/1994 |
| JP | 8-46024 | 2/1996 |
| JP | 8-222735 | 8/1996 |
| JP | 10-56154 | 2/1998 |
| JP | 10-303289 | 11/1998 |

OTHER PUBLICATIONS

"Experimental Results and Simulation Analysis of 250V Super Trench Power MOSFET (STM)", by Nitta et al., The 12th International Symposium on Power Semiconductor Devices & ICs (May 22–25, 2000).

* cited by examiner

*Primary Examiner*—David E. Graybill
(74) *Attorney, Agent, or Firm*—McDermott, Will & Emery

(57) ABSTRACT

The elements and the trenches are arranged alternately, in repetition, on the main surface of a semiconductor substrate, each of the plurality of elements arranged alternately, in repetition, with the trenches has a configuration (for example, STM) which operates in the same operational mode, and an insulating layer, which is filled into the trenches, and doesn't have a void at a position (the position shallower than the broken line L) shallower than the pn junction to which the largest electric field in the element is applied. Thereby, a semiconductor device and a process for the same, where voids inside of the trenches can be reduced and the film thickness of the insulating film, for filling in the trenches which remain on the surface of the semiconductor substrate, can be made thinner, can be gained through a simple method.

8 Claims, 14 Drawing Sheets

SEMICONDUCTOR DEVICE HAVING TRENCHES AND PROCESS FOR SAME

BACKGROUND OF THE INVENTION

1. Field of the Invention

The present invention relates to a semiconductor device having trenches and a method for the same, in particular, to an improvement of the functions of a semiconductor device having trenches as well as to an improvement of the yield.

2. Description of the Background Art

FIGS. 18 and 19 are schematic cross section views showing a method of filling in a trench in accordance with the order of the steps according to a prior art. First, referring to FIG. 18, a trench 102 is formed in the surface of a semiconductor substrate 101 using, for example, anisotropic etching.

Referring to FIG. 19, an insulating film 103 made of, for example, a silicon oxide film is formed on the semiconductor substrate 101 so as to be filled into this trench 102 through, for example, a CVD (Chemical Vapor Deposition) method. In this way, the trench 102 is filled in.

In a method of filling in the trench 102 according to the prior art, however, the insulating film 103 has the characteristic that it is deposited more at the aperture part R1 of the trench 102 than inside of the trench 102. Therefore, in the case of a trench 102 which has a large aspect ratio (depth D/width W), the trench 102 is closed at the aperture part R1 before the inside of the trench 102 is completely filled in. Therefore, the trench 102 cannot be filled in completely and, in many cases, a void 102a is left within the trench 102. Especially, in the case that the aspect ratio of the trench 102 exceeds 10, or in the case that silicon oxide film ($SiO_2$) which is formed through a CVD method is used for filling, this phenomenon becomes significant.

In the case that the void 102a which is left inside of the trench 102 is large, there is a possibility that it affects the electric characteristics (main breakdown voltage or the like) of the semiconductor device. In addition, there are cases where thermal expansion and shrinkage are repeated in the vicinity of the void 102a due to temperature change in the operational environment of the semiconductor device so that the reliability for a long period of operation time is significantly harmed. Particularly, in the case that there is a void 102a in the vicinity of a pn junction to which the largest electric field of the device is applied, the above described problem of the reliability becomes more significant. In addition, in many cases of a power semiconductor device which is exposed to a high temperature and, therefore, this problem is significant.

The film thickness of the filled in material 103, with which the trench 102 is filled in, essentially needs to be ½, or more, of the width W of the trench 102 at the minimum. Therefore, the wider the width W of the trench 102 is the thicker the film thickness T, of the insulating film 103 which is deposited on the surface of the semiconductor substrate 101, is according to the width W of the trench 102. In the case that the film thickness T of the insulating film 103 which is deposited on the surface of the semiconductor substrate 101 is large, the step between respective surfaces of the semiconductor substrate 101 and the insulating film 103 becomes large. Therefore, a problem arises in the structure, or in the following manufacturing steps, wherein the formation of contact holes or the patterning of a conductive layer in the vicinity of this step become difficult.

In order to solve the above described problem caused by the above step, the insulating film 103, which is deposited on the surface of the semiconductor substrate 101 after being filled in into the trench 102, may be removed. It is difficult, however, to remove only the insulating film 103 which is deposited thickly on the surface of the semiconductor substrate 101 while leaving most of the insulating film 103 inside of the trench 102 by removal through ordinary dry and wet etching methods. As for a comparatively excellent method, there is a method of removing the insulating film 103 which remains on the surface of the semiconductor substrate 101 by using a CMP (Chemical Mechanical Polishing) method, or the like. Even in the case when this method is used, however, the void 102a, which has been formed inside of the trench 102, cannot be eliminated.

SUMMARY OF THE INVENTION

The purpose of the present invention is to provide a semiconductor device and a process for the same which can reduce the void inside of the trench in a simple method and which can make thinner the film thickness of the insulating film for filling in the trench which remains on the surface of the semiconductor substrate.

In a semiconductor device having a trench according to the present invention, elements and trenches are alternately and repeatedly arranged in the main surface of the semiconductor substrate wherein each of the plurality of elements arranged alternately with trenches repeatedly has a structure which is operated in the same operation mode and the insulating film which is filled in into the trenches does not have any voids in the vicinity of the pn junction to which the largest electric field of the element is applied or in the positions shallower than the pn junction.

In the semiconductor device having the trench according to the present invention this void can be prevented from affecting the element since the insulating film which fills in into the trench does not have any voids in the vicinity of a pn junction to which the largest electric field of the element is applied or in the position shallower than the pn junction.

In the case that the aspect ratio of the trench is 10, or more, in the above described semiconductor device, the occurrence of the void within the trench can be prevented particularly effectively.

In the case that the depth of the trench is 5 $\mu$m, or more, in the above described semiconductor device, the occurrence of the void within the trench is particularly prevented so that the harmful effect to the element by the occurrence of the void can be significantly prevented.

In the above described semiconductor device, in the case that the element has the first impurity region of the first conductive type which is formed on one side of the mesa region sandwiched between adjacent trenches, the second impurity region of the second conductive type which is formed on the other side of the mesa region and which forms a pn junction with the first impurity region and the third impurity region of the second conductive type which is formed on at least part of the main surface of the first impurity region, the harmful effect to the element due to the occurrence of the void can be particularly significantly prevented since the influence given to the element by the void within the trench is large.

In the above described semiconductor device, in the case that the third impurity region is a body part of an insulating gate-type field effect transistor and the pn junction to which the largest electric field of the element is applied is formed of the third impurity region and the first impurity region, the harmful effect to the element due to the occurrence of the void can be particularly significantly prevented since the electric field which is applied to the pn junction is large so that a large electric field is easily applied to the void.

A process for a semiconductor device according to the present invention includes the step of forming a trench in the main surface of a semiconductor substrate, the step of forming a first insulating film on the main surface of the semiconductor substrate in one step or in a plurality of divided steps so as to be filled in to the trench, the step of forming an aperture (opening portion) which reaches to the inside the trench in the first insulating film through an anisotropic etching in the first insulating film so that the upper edge corner parts of the aperture in the first insulating film has more round edge than the upper edge corner parts of the trench and of reducing the film thickness of the insulating film on the main surface of the semiconductor substrate and the step of forming a second insulating film on the main surface of the semiconductor substrate in one step or a plurality of divided steps so as to be filled in to the aperture.

According to the process for a semiconductor device of the present invention, the upper edge corner parts of the aperture are made to have round edge through an anisotropic etching. Therefore, the second insulating film can be prevented from closing the upper edge parts of the aperture before being filled into the aperture at the time of the formation of the second insulating film. Thereby, it becomes possible to reduce the void within the aperture or completely eliminate the void by filling in the aperture with the second insulating film so that the harmful effect to the element due to this void can be prevented.

In addition, since the film thickness of the insulating film on the main surface of the semiconductor substrate can be reduced through an anisotropic etching, the insulating film for filling in the trench can be prevented from remaining thickly on the main surface of the semiconductor substrate. Therefore, the disadvantage that the insulating film which has remained thickly causes a large step between the main surface of the semiconductor substrate and the upper surface of the insulating film can be improved.

In the above described process for semiconductor substrate, preferably the step of forming the first insulating film, the step of etching anisotropically the first insulating film and the step of forming the second insulating film are repeated twice, or more, in this order.

Thereby, the inside of the trench of which the aspect ratio is significantly large can be filled in with the insulating film without producing a void.

In the above described process for a semiconductor device, the first and the second insulating films are, preferably, any of a silicon oxide film, a silicon nitride film and a complex film of a silicon oxide film and a silicon nitride film, formed through a chemical vapor deposition method.

Thereby the first and the second insulating films can be easily formed, formed through a chemical vapor deposition method.

In the above described process for a semiconductor device, before the completion of the filling in of the aperture with the first insulating film or before the completion of the filling in of the aperture with the second insulating film, preferably sintering treatment is carried out in order that the insulating film within the trench is made higher in the density physically or stoichiometrically so as to reduce the stress and that the stress occurrence due to the thermal treatment in the following steps is suppressed.

Thereby, a breakdown of the semiconductor device caused by the difference in the heat expansion between silicon of the semiconductor substrate and a silicon oxide film of the insulating film can be prevented.

In the above described process for a semiconductor device, the sintering treatment is carried out at a temperature of 800° C., or more, and under a water vapor atmosphere, a burning oxidization atmosphere or an atmosphere of a high partial pressure of oxygen (an atmosphere with high oxygen content).

Thereby, the stress of the silicon oxide film can be effectively reduced.

In the above described process for a semiconductor device, preferably, the temperature in the sintering treatment is higher than in any other temperatures in the following steps.

Thereby, the stress occurrence due to the thermal treatments in the following steps can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention are described with reference to the drawings.

(First Embodiment)

Figure 1:
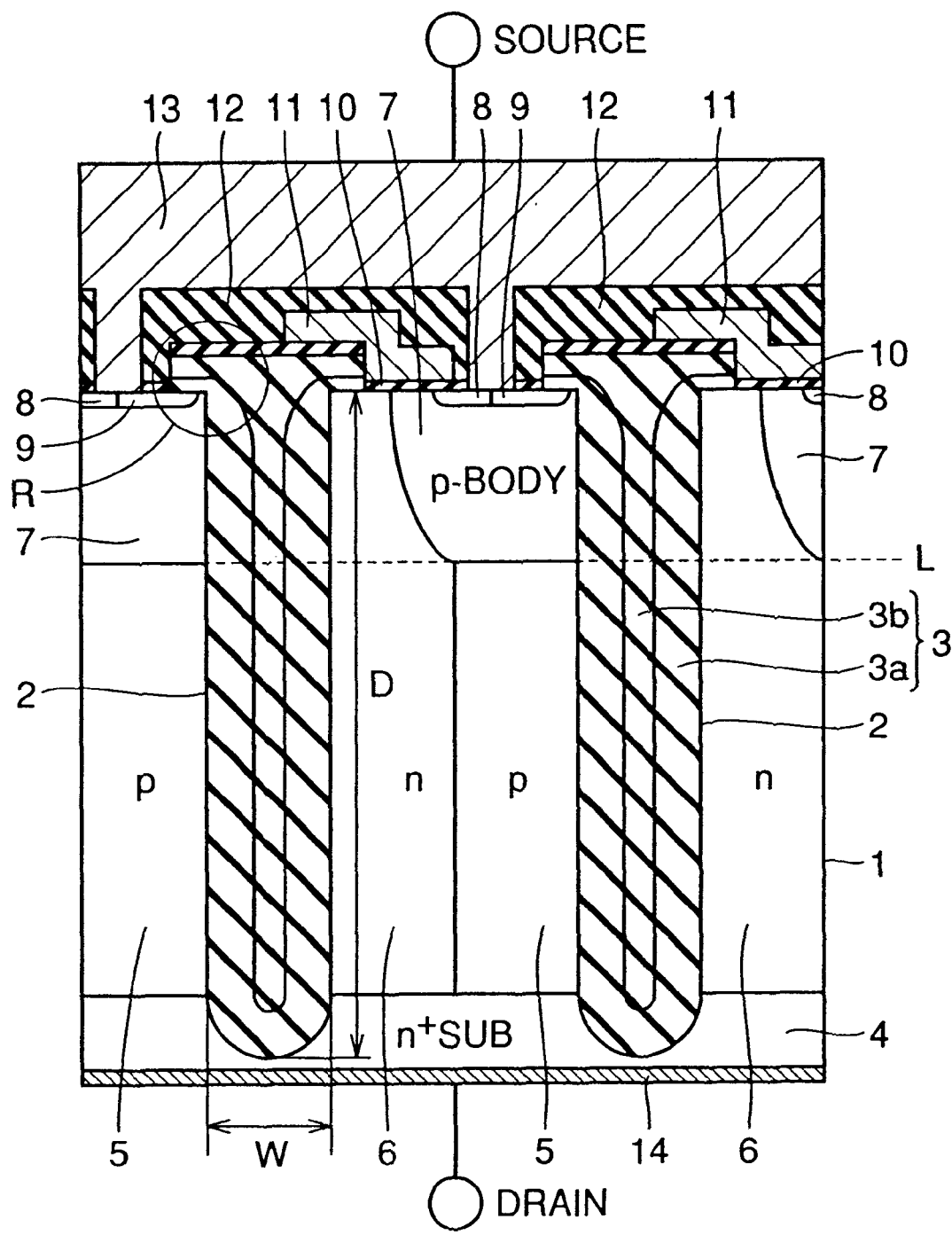
FIG. 1 is a cross section view schematically showing a configuration of a semiconductor device having trenches according to a first embodiment of the present invention.

Referring to FIG. 1, a plurality of trenches 2 and a plurality of elements are arranged alternately in repetition in the first main surface of a semiconductor substrate 1 made of, for example, silicon. Such device is, for example, STM (Super Trench Power MOSFET) as shown in U.S. Pat. No. 6,040,600 and each component of the STM has the following structure.

A p-type diffusion region 5 is formed on one side of a mesa region sandwiched between adjoining trenches 2. In addition, an n-type diffusion region 6 which forms a pn junction with the p-type diffusion region 5 is formed on the other side of the above described mesa region. A p-type body 7 is formed so as to be electrically connected to the p-type diffusion region 5 and to be formed on, at least, part of the first main surface side of the n-type diffusion region 6 so as to form a pn junction with the n-type impurity region 6. A source n$^+$ diffusion region 8 and a p$^+$ diffusion region 9 are formed next to each other on the first main surface within the p-type body 7.

A gate electrode layer 11 is formed so as to face, via a gate insulating film 10, the p-type body 7 sandwiched between the n-type diffusion region 6 and the source n$^+$ diffusion region 8. A interlayer insulating film 12 is formed on the gate electrode layer 11. A source electrode 13 is formed so as to be electrically connected to both of the source n$^+$ diffusion region 8 and the p$^+$ diffusion region 9 via a contact hole provided in the above interlayer insulating film 12.

A drain n$^+$ diffusion region 4 is formed on the second main surface side of the p$^+$ diffusion region 5 and n-type diffusion region 6. A drain electrode 14 is formed on the second main surface so as to be electrically connected to the above drain n$^+$ diffusion region 4.

Figure 2:
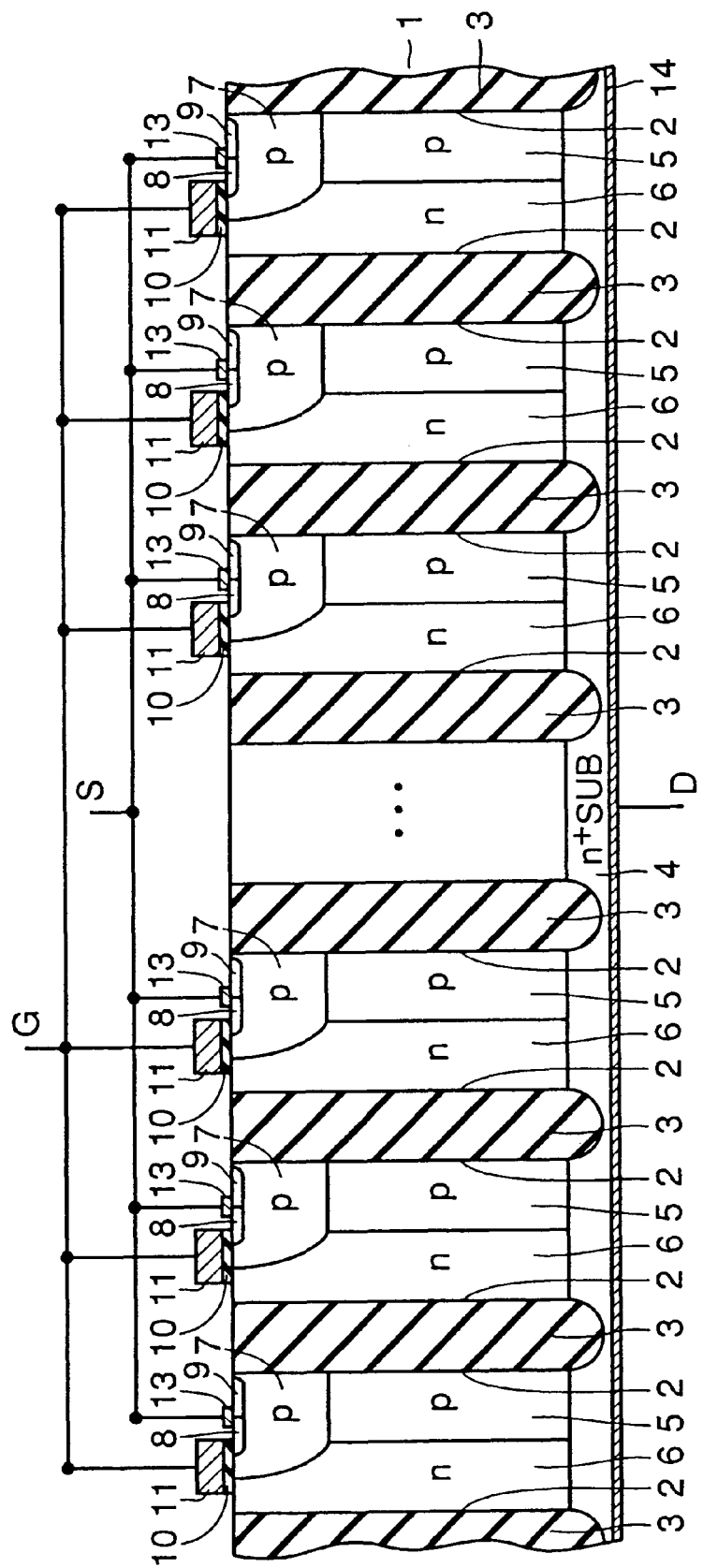
FIG. 2 is a view for describing that each of the elements formed in the semiconductor device having trenches according to the first embodiment of the present invention has a configuration which operates in the same mode.

In this way, each of the plurality of elements deposited alternately with the trenches 2 in repetition has the structure which operates in the same operation mode in the STM. Here, the structure which operates in the same operation mode means that corresponding parts of the plurality of elements are respectively formed so as to be at the same potential. That is to say, referring to FIG. 2, the gate electrodes 11, for example, are all electrically connected to each other, the source n$^+$ diffusion regions 8 are all electrically connected to each other and the drain n$^+$ diffusion regions 4 are all electrically connected to each other.

Referring to FIG. 1, the trenches 2 are filled with an insulating film 3 made of, for example, a silicon oxide film. This insulating film 3 is formed of, for example, insulating films 3a and 3b which are two or more layers. The insulating film 3a is formed so as to be in contact, at least, with the side wall of the trench 2 and has upper end corner parts which spread outward with a slope more gentle than that of the opening edge corner parts of the trench 2 in the vicinity of the opening edge part R of the trenches 2. The insulating film 3b fills in to the internal peripheral regions of the insulating film 3a.

The insulating films 3a and 3b may be made of, in addition to a silicon oxide film (SiO$_2$), a silicon nitride film (Si$_3$N$_4$) or a mixture film of a silicon oxide film and a silicon nitride film (silicon oxide nitride film (SiON)). And the insulating films 3a and 3b may be made of mutually different materials such that one is a silicon oxide film and the other is a silicon nitride film. Even in the case that the insulating films 3a and 3b are made of the same material, the interface between these insulating films 3a and 3b can be recognized.

This insulating film 3 does not have a void in the vicinity of a pn junction to which the largest electrical field in the element is applied or in the positions shallower than this pn junction (that is to say, on the first main surface side of the broken line L). Here, it is preferable that the insulating film 3 does not have a void at all within the trenches 2.

Here, the "vicinity of the pn junction" is in a range wherein a strong electric field generated at the pn junction has a significant effect and the range is approximately 1 μm or so, though it differs depending on the breakdown voltage of the element. In addition, the pn junction can be recognized, for example, through a potential contrast method utilizing a scanning electron microscope (SEM), through a scanning capacitance microscope (SCM) or through a staining method of stain etching type such as Jilter etching or Secco etching.

In the case that the aspect ratio of these trenches 2 is 10 or more, the effects of the present invention are remarkable and in the case that the depth of the trenches 2 is 5 μm or more, the effects of the present invention are also remarkable.

Basically, it is preferable that the inside of the trenches 2 has no void at all. In the case that a void remains in the trenches 2, there is a possibility that the electric characteristics (the main breakdown voltage or the like) is negatively affected and there are cases where reliability with respect to a long term operation is significantly impaired by the repetition of the expansion and shrinkage in the vicinity of the void due to the temperature change in the operational environment of the semiconductor device. Particularly, in the semiconductor device, the occurrence of the void is tolerated only in the parts of the trenches 2 which are deeper than the pn junction parts to which the largest electric field is applied. In the present embodiment, such voids as described above do not exist, or even in the case that they exist, they are the places which are the hardest to be influenced (that is to say, they are the positions deeper than the pn junctions to which the largest electric field is applied in the elements) and, therefore, the electric characteristics such as the main breakdown voltage can be increased and the reliability can also be increased more than in a prior art.

Particularly, in the STM, in a power semiconductor device which requires a deep trench separation between elements, or in a vertical type power semiconductor device wherein the main current flows between the front and back surfaces of the wafer, the depth D of the trenches 2 is, in many cases, 5 μm or more unlike comparatively shallow trenches which are applied for element separation in a conventional LSI (Large Scale Integrated Circuit). In addition, since the trenches 2 are deep, the ratio (aspect ratio) of the depth D of the trenches to the width W of the trenches 2 automatically becomes a large value of 10 or more. In addition, in many cases, a power semiconductor device is exposed in a high temperature for a long time or a heat cycle is applied to the device so that, in the case that a void exists in the trenches 2, the affects of the void are more remarkable compared to the case of an LSI. In such a case, the structure with less voids according to the present embodiment has the effects that increase the reliability.

(Second Embodiment)

Next, a process for a semiconductor device having trenches is described.

Figure 3:
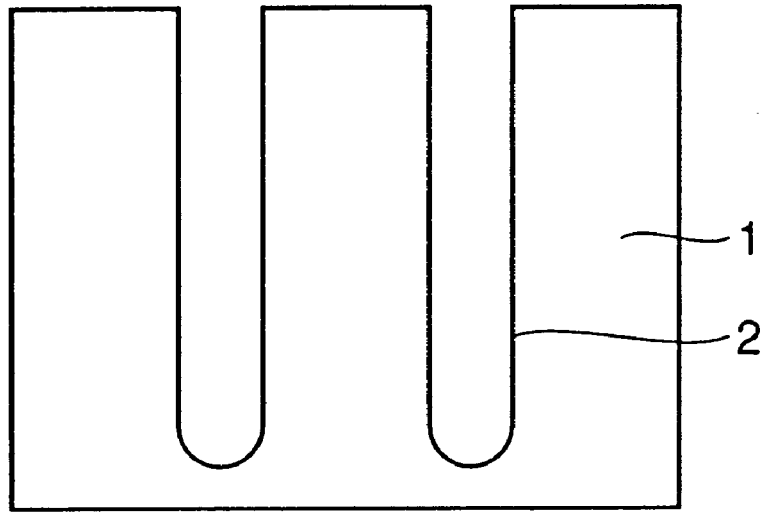
FIGS. 3 to 6 are schematic cross section views showing a process, following the steps in order, for a semiconductor device having trenches according to a second embodiment of the present invention.

First, referring to FIG. 3, a plurality of trenches 2 are formed through a conventional photomechanical technology and etching technology in the first main surface of a semiconductor substrate 1 made of, for example, silicon.

Figure 4:
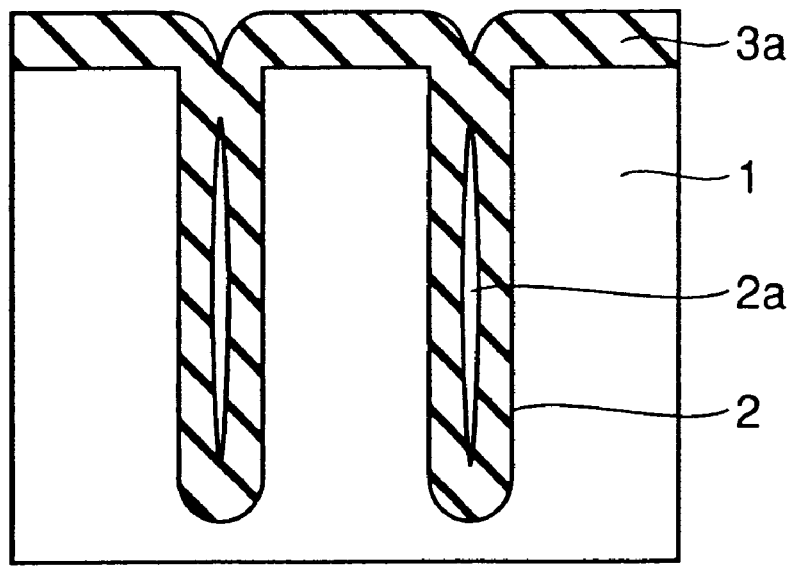

Referring to FIG. 4, an insulating film 3a made of, for example, a silicon oxide film, is formed in one step, or in a plurality of divided steps, in the main surface of the semiconductor substrate 1 so as to fill in the inside of the trenches 2 through, for example, a low pressure CVD method. In this case, the aperture parts of the trenches 2 are closed while voids 2a still remain inside of the trenches 2. This is because the insulating film 3a has the property of accumulating more on the aperture parts of the trenches 2 than on the inside of the trenches 2. In the case that those voids 2a are large or are in the positions where the electric field is strong in intensity at the time of the operation of the semiconductor device, there is a possibility that a problem may arise that affects the electric properties or reliability. In addition, in this condition the insulating film 3a which is used for filling in the trenches 2 remains with the same film thickness on the first main surface.

Figure 5:
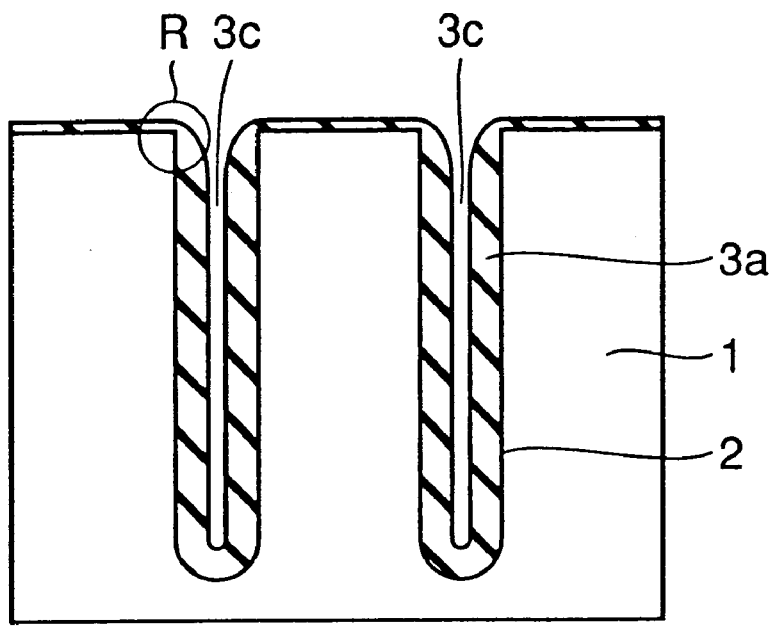

Referring to FIG. 5, anisotropic etching is applied to the entire surface. Due to the anisotropic etching the insulating film 3a on the first main surface of the semiconductor substrate 1 and the insulating film 3a at the bottom of the trenches 2 are etched while the insulating film 3a along the side walls of the trenches 2 is hardly etched. Therefore, the aperture (opening portion) 3c can be formed by connecting the voids 2a to the outside and the film thickness of the insulating film 3a on the first main surface can be made thinner. In addition, through this anisotropic etching, the upper edge corner parts R of the apertures 3c, of the insulating film 3a, can be made in a form which spreads outwards with a slope more gentle than that of the upper edge corner parts of the trenches 2.

Figure 6:
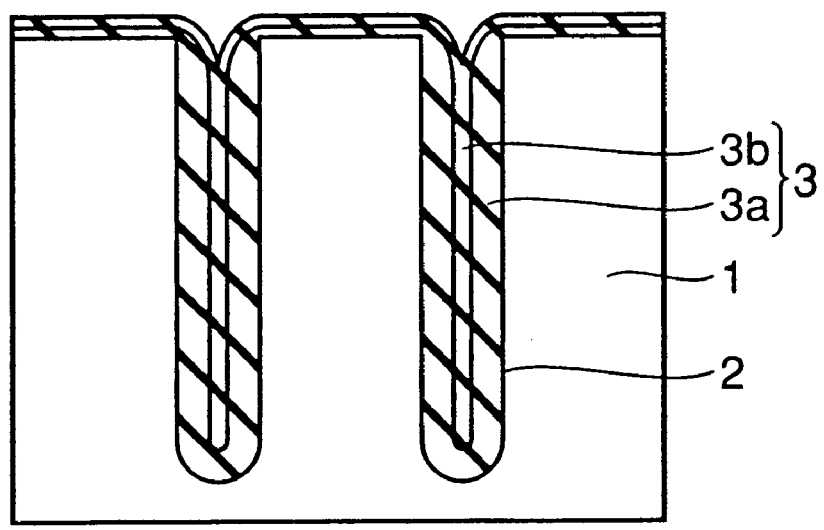

Referring to FIG. 6, an insulating film 3b made of, for example, a silicon oxide film, is formed in one step, or in a plurality of divided steps, through, for example, a CVD method so as to fill in the trenches 2. At this time, the insulating film 3a of the first step almost totally remains, without being etched, on the side walls of the trenches 2 and, therefore, the amount of the insulating film 3b, used for filling in, is much smaller than the amount of the insulating film 3a, used for filling in. Therefore, the sum of the film thickness of the insulating films 3a and 3b remaining on the first main surface of the semiconductor substrate 1 can be made thinner than the film thickness of the insulating film 3a, as shown in FIG. 4. In addition, since the film thickness used for the filling in is thin and the aperture form of the apertures 3c is in a shape spreading smoothly outward in the filling in of the insulating film 3b and, thereby, it becomes possible to fill in so as not to cause voids inside of the trenches 2 even in the case that the insulating film 3b is deposited in a larger amount by the aperture parts of the apertures 3c.

In order to make the film thickness of the insulating film 3, which remains on the first main surface of the semiconductor substrate 1, even thinner and to make the voids inside of the trenches 2 fewer, the above described anisotropic etching and the filling in step of the insulating film 3b may be repeated.

According to the present embodiment, as described above, anisotropic etching is carried out through the processes as shown in FIGS. 4 and 5, and the insulating film 3b is formed in the step as shown in FIG. 6 and, thereby, the inside of the trenches 2 can be almost totally filled in, without leaving voids, so that the film thickness of the insulating film 3 which remains on the first main surface of the semiconductor substrate 1 can, further, be made thinner. Therefore, the electric properties and reliability of the semiconductor device can be increased due to the reduction of the voids and, at the same time, a various of problems can be corrected in the later manufacturing steps by enabling the film thickness of the insulating film 3 on the first main surface to be made thinner.

Figure 7:
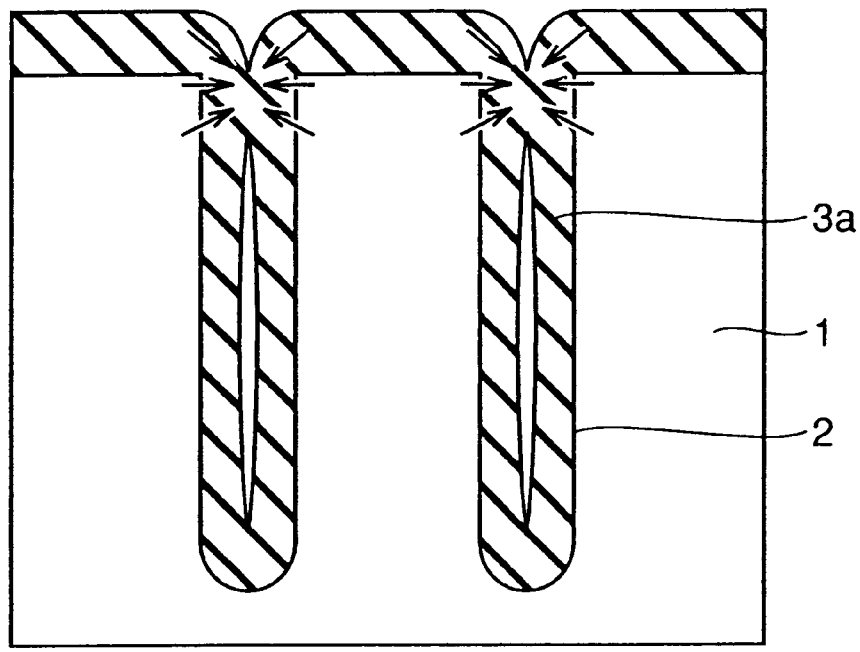
FIG. 7 is a view showing the state where stress is concentrated at an aperture part in the case that a CVD oxide film closes the aperture part.

Here, it is necessary to apply a sintering process to the material 3a, which is filled in the trenches 2, somewhere in the manufacturing process. As shown in FIG. 4, however, it is preferable not to carry out sintering under the condition where the insulating film 3a closes the aperture parts of the trenches 2. This is because at this time of sintering physical (density) or chemical (the manner of combination between silicon and oxygen changes in the case that the insulating film 3a is a silicon oxide film, extra hydrogen or oxygen which has remained move out, the stoichiometric void is eliminated, or the like) change in quality occurs or the stress due to the difference of the thermal expansion coefficients of the insulating film 3a and the semiconductor substrate 1 occurs and, thereby, the stress concentrates on the aperture parts, as shown in FIG. 7, so as to cause the possibility that the insulating film 3a pushes or pulls the mesa region of the semiconductor substrate 1 so as to break the semiconductor substrate 1. Accordingly, in the present embodiment, it is preferable to carry out sintering once before the trenches 2 are completely filled in and, after that, the trenches 2 are filled in.

Figure 8:
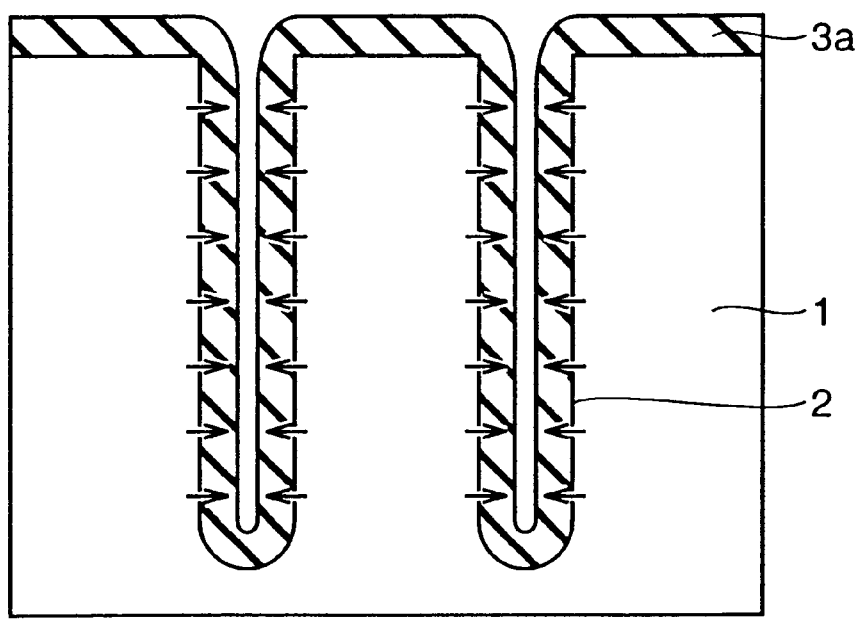
FIG. 8 is a view showing the state where stress is not concentrated at an aperture part in the case that a CVD oxide film closes the aperture part.

More concretely, it is preferable to carry out sintering of the silicon oxide film 3a at the midway stage of the filling in of the silicon oxide film 3a or in the condition where the apertures 3c is not closed, as shown in FIG. 5. This is because the stress doesn't concentrate in one part, as shown in FIG. 8, under this condition.

(Third Embodiment)

Next, based on the second embodiment detailed conditions of the case of manufacturing a power semiconductor device of which the breakdown voltage is 200 to 400 V are concretely described.

Referring to FIG. 3, trenches 2 of the depth of 17 $\mu$m, the width of 1.4 $\mu$m and the aspect ratio of approximately 12 (=17/1.4) are formed through a conventional photomechanical technology and etching technology.

Referring to FIG. 4, a silicon oxide film (hereinafter referred to as a CVD oxide film) through a low pressure CVD method is formed on the entire surface. Here, the CVD oxide film has the property of being deposited thickly in the corner parts within the aperture parts of the trenches 2 and, therefore, the aperture parts are closed before the inside of the trenches 2 is filled in according to a conventional method of filling in so that large voids 2a remain in the trenches 2. In addition, since the circulation of the gas in the trenches is poor, the CVD oxide film formed on the side walls inside of the trenches 2 is thinner than the film thickness of the CVD oxide film deposited on the first main surface of the semiconductor substrate 1. Therefore, it is necessary to deposit a CVD oxide film which is thicker than ½ of the width of the trenches 2 and, in this case, it is necessary to form a CVD oxide film of the film thickness of 1 $\mu$m or more.

According to the present embodiment, first the CVD oxide film is formed with the film thickness of approximately 800 nm. Though 800 nm+800 nm=1.6 $\mu$m, the CVD oxide film formed on the side walls inside of the trenches 2 is thinner than the film thickness of the CVD film formed on the first main surface of the semiconductor substrate 1 and, therefore, the aperture parts of the trenches 2 are not yet closed at this stage. It is preferable the CVD oxide film is sintered at this stage. This is because a large stress applied to the aperture parts of the trenches 2 so as to create the possibility of a crack in the semiconductor substrate 1 in the case that sintering is carried out after the aperture parts of the trenches 2 are closed.

Ideally, it is preferable that sintering is carried out at a high temperature of 800° C. or more and in an atmosphere of steam, in an atmosphere of burning oxidization or in an atmosphere of high oxygen concentration. This is because, in these cases, sintering effects are large compared to the cases of low temperature of 800° C. or less or in a nitrogen atmosphere so that the stress which is generated in the later process becomes smaller. In addition, this sintering temperature is, preferable, higher than any other temperature in the later process.

After this sintering, a CVD oxide film of approximately 350 nm is, deposited and then the aperture parts of the trenches 2 are completely closed by the CVD oxide film 3a. At this stage, large voids 2a remain inside of the trenches 2.

Referring to FIG. 5, anisotropic etching is applied to the entire surface. Thereby, the CVD oxide film 3a on the first main surface of the semiconductor device 1 is removed through etching to become a thinner film and, at the same time, the voids 2a are connected to the outside so as to form the apertures 3c. At this time, in order to prevent damage to the first main surface of the semiconductor substrate 1 through etching, it is preferable to stop the etching under the condition where the CVD oxide film 3a remains in a small amount (50 nm) on the first main surface.

Anisotropic etching makes it possible to thinner the CVD oxide film 3a on the first main surface of the semiconductor substrate 1 and open the aperture, with etching the CVD oxide film 3a on the side walls of the trenches 2 little.

Referring to FIG. 6, a CVD oxide film is, again, formed with the thickness of 350 nm on the entire surface. Voids remaining in the trenches 2 become smaller, to a great extent, compared to the first filling in (FIG. 4) or can be completely eliminated. In addition, in the case that the width of the trenches 2 is 1.4 $\mu$m, it becomes possible to be the film thickness of the CVD oxide film 3 on the first main surface of the semiconductor substrate 1 to approximately 400 nm.

Figure 9:
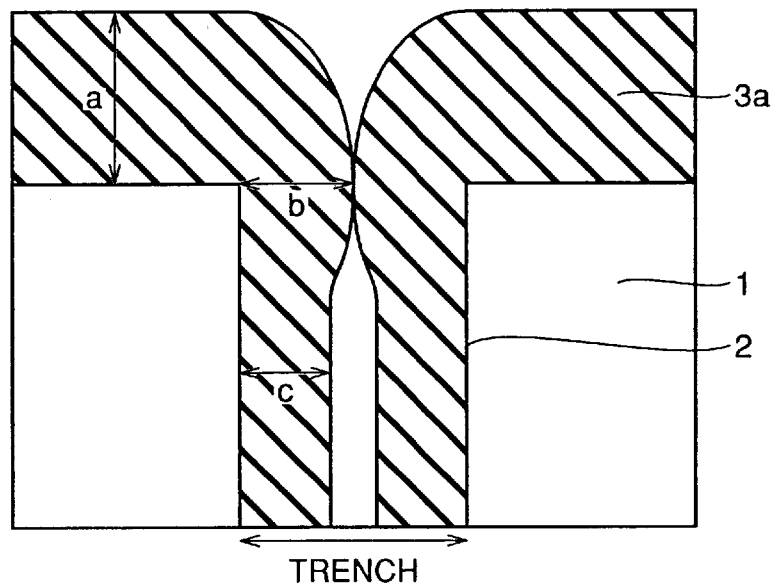
FIG. 9 is a view showing the relationship of the film thickness of each part in the state where a CVD oxide film closes the aperture part.

Here, the form in the vicinity of the aperture parts of the trenches 2 in FIG. 4 is shown in an enlarged scale in FIG. 9. Referring to FIG. 9, a CVD oxide film 3a of 1150 nm is formed on the first main surface of the semiconductor substrate 1 in this condition. And, the relationship of the film thickness of each part of this CVD oxide film 3a, is, in general, a>b>c.

In the insulating film 3b, as shown in FIG. 6, however, the film thickness is much smaller than the film thickness of the CVD oxide film 3a, as shown in FIG. 4. Thereby, the relationship of the film thickness of each part of this CVD oxide film 3b, is b≈c>a. Therefore, the closure of the aperture parts of the trenches 2, before the inside of the trenches 2 are completely filled in, can be prevented due to the additional factor of the gentle slope in the aperture part form of the CVD oxide film 3a in FIG. 6. Therefore, voids inside of the trenches 2 can be significantly reduced or can be completely eliminated.

By using the method of the present embodiment, voids inside of the trenches 2 particularly in a power semiconductor device of which the breakdown voltage is 200 to 400 V can be reduced or can be eliminated so that the electric properties and reliability, such as main breakdown voltage, can be increased. In addition, the film thickness of the CVD oxide film 3 in the first main surface of the semiconductor substrate 1 can be made thinner so that problems later in the manufacturing process can be lessened.

(Fourth Embodiment)

Next, a process according to the present invention which is applied to STM is described.

Figure 10:
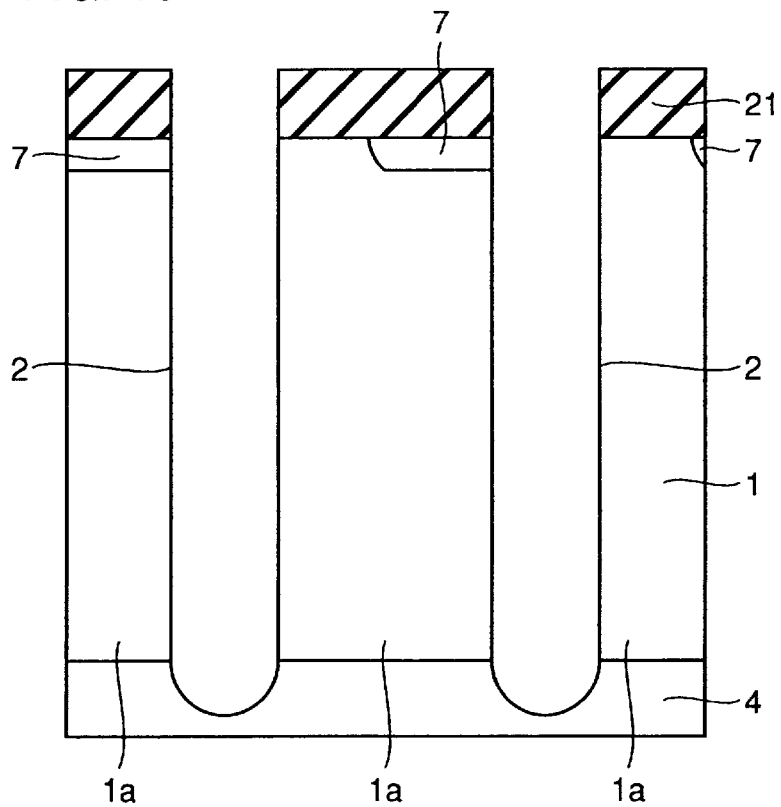
FIGS. 10 to 17 are schematic cross section views showing a process, following the steps in order, for a semiconductor device having trenches according to a fourth embodiment of the present invention.

Referring to FIG. 10, an n-type epitaxial layer 1a which has a sufficiently low impurity concentration is formed on an n-type high impurity concentration substrate 4 which becomes a drain n$^+$ layer. A p-type diffusion region 7 which becomes a p-type body of a MOSFET is formed on the surface of the above n-type epitaxial layer 1a by using a conventional impurity implanting method. A silicon oxide film 21 is formed on this p-type diffusion region 7 so as to be in a desired form. By using this silicon oxide film 21 as a mask an anisotropic etching is applied to the layer beneath it.

Through this anisotropic etching a plurality of trenches 2 which reach to the n$^+$ high impurity concentration substrate 4 and which penetrate the p-type diffusion region 7 and the n-type epitaxial layer 1a are formed.

Figure 11:
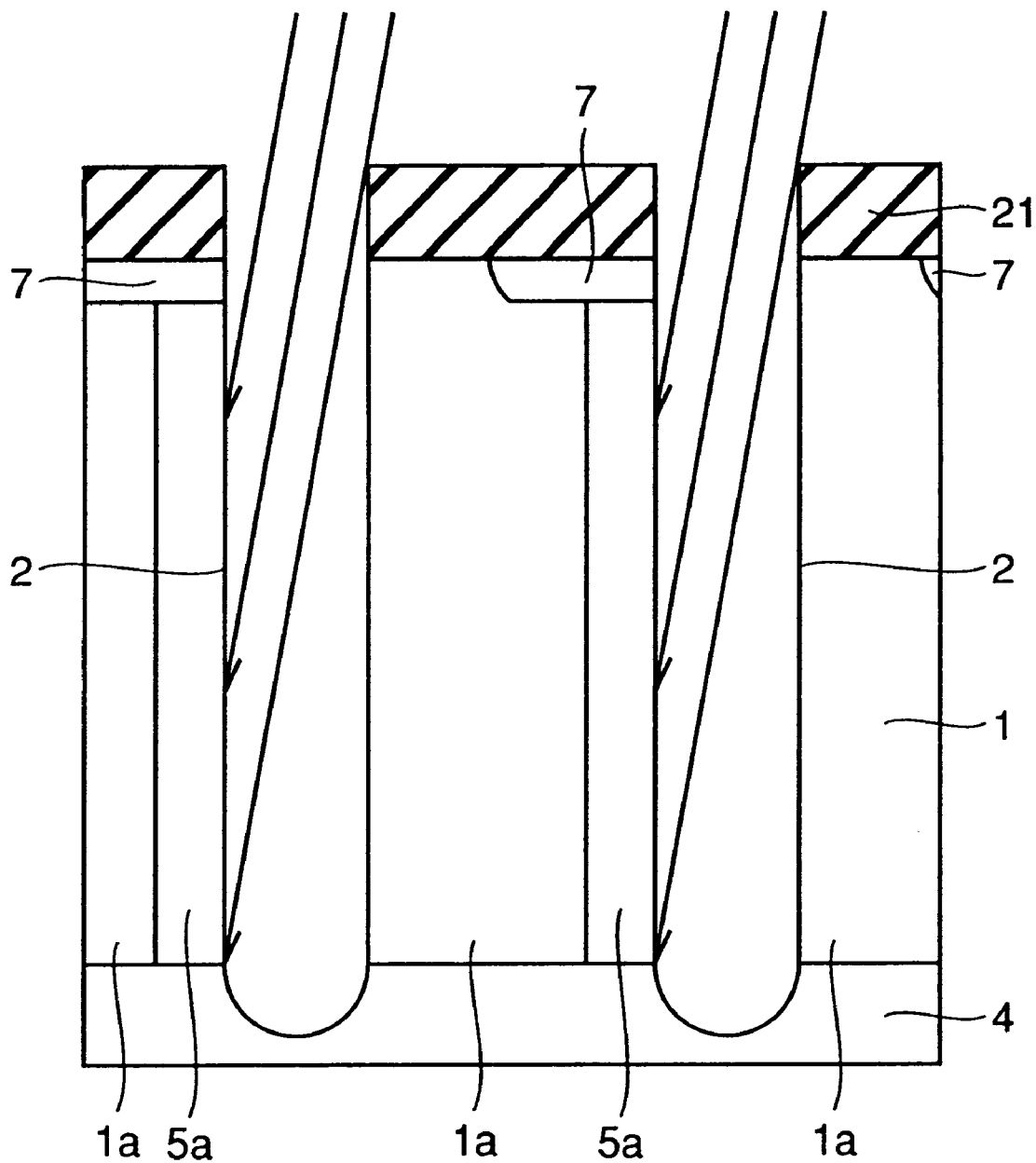

Referring to FIG. 11, boron is implanted into the mesa regions, which is sandwiched between trenches 2 by way of, for example, a diagonal ion implantation so as to form p-type diffusion regions 5a.

Figure 12:
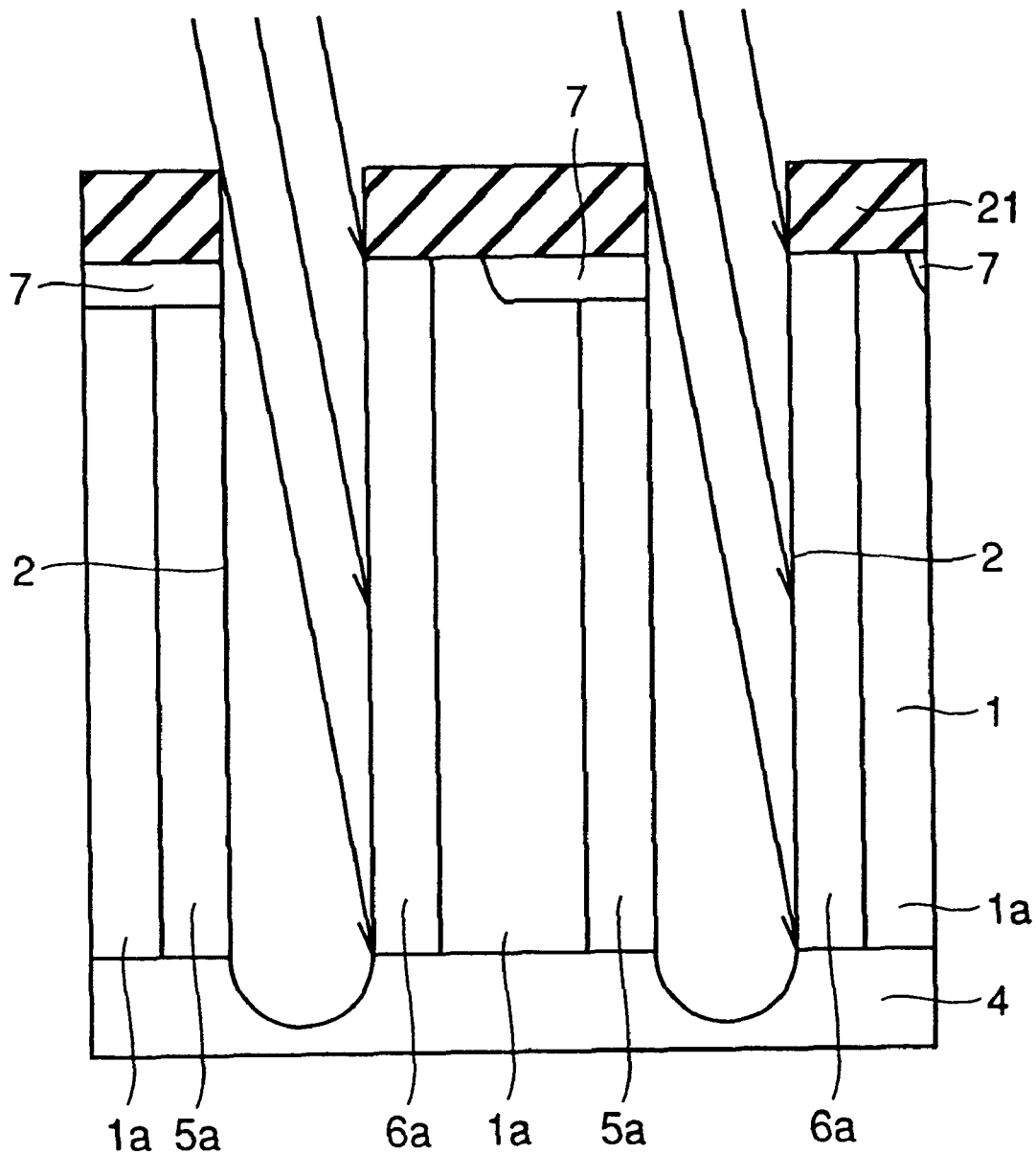

Referring to FIG. 12, phosphorous is implanted to the other side of the mesa regions by way of, for example, a diagonal ion implantation so as to form n-type diffusion regions 6a.

Figure 13:
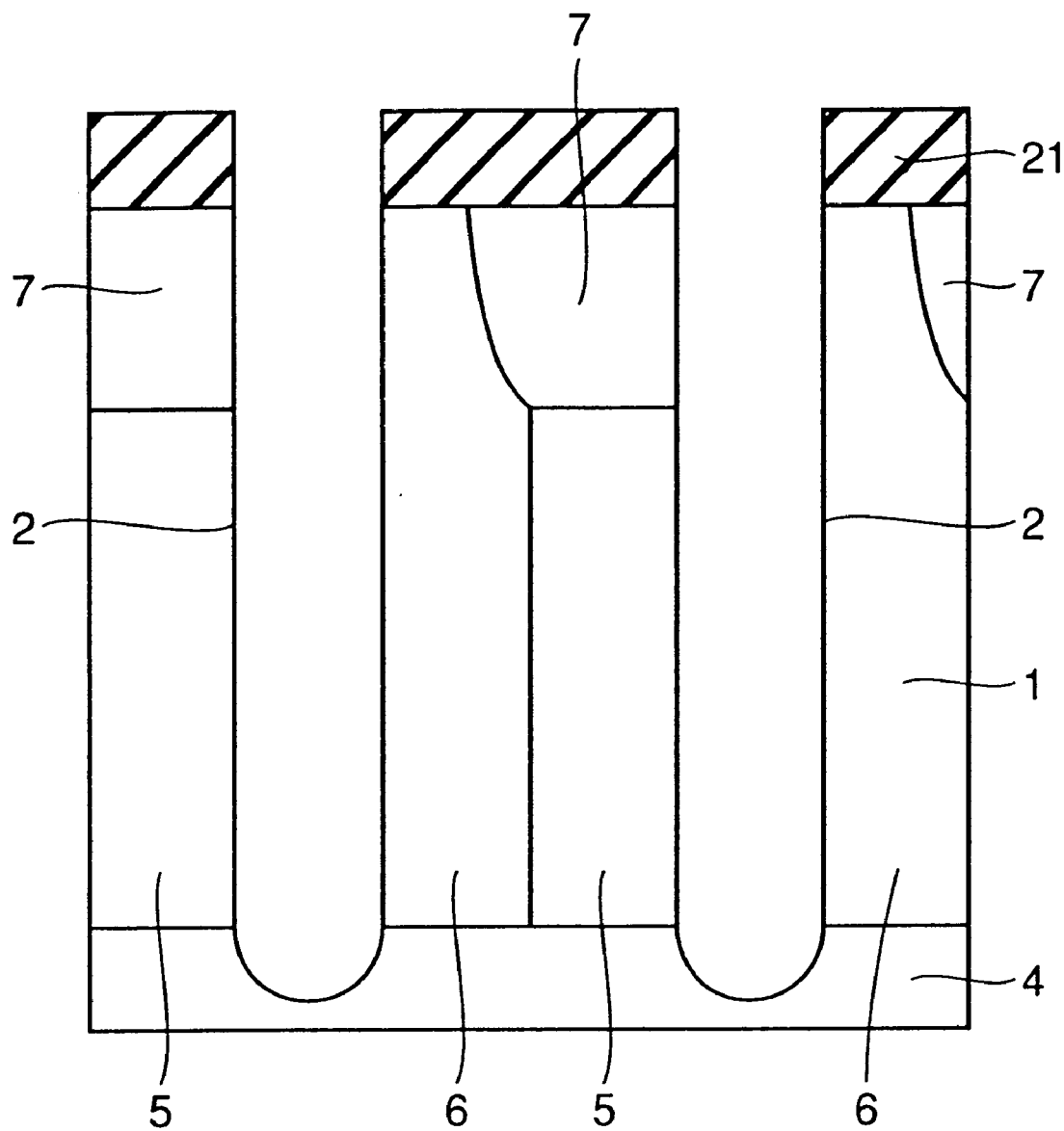

Referring to FIG. 13, thermal treatment is carried out in order to make the profile of the p-type and n-type impurities introduced by the ion implantation become closer to the finally required diffusion profile. Thereby, the p-type diffusion region 7 is diffused to become a p-type body and the p-type diffusion region 5a the n-type diffusion region 6a diffuse to become a p-type diffusion region 5 and an n-type diffusion region 6, which form a p-n junction each other. After that, the silicon oxide film 21 is removed through, for example, etching or the like.

Figure 14:
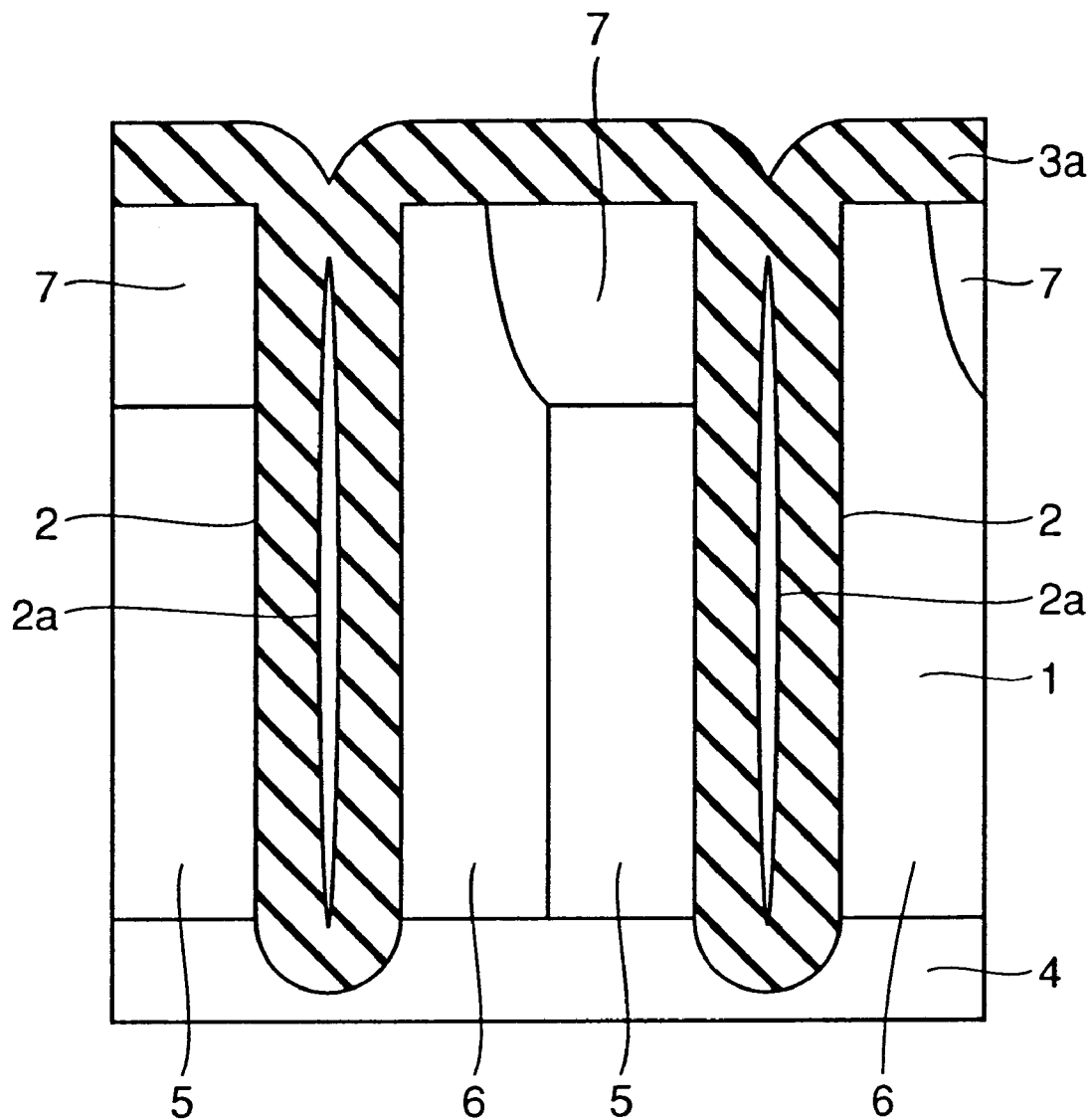

Referring to FIG. 14, a silicon oxide film 3a is formed in the first main surface through, for example, a CVD method so as to fill in the inside of the trenches 2. At this stage, voids 2a are remained inside of the trenches 2.

Figure 15:
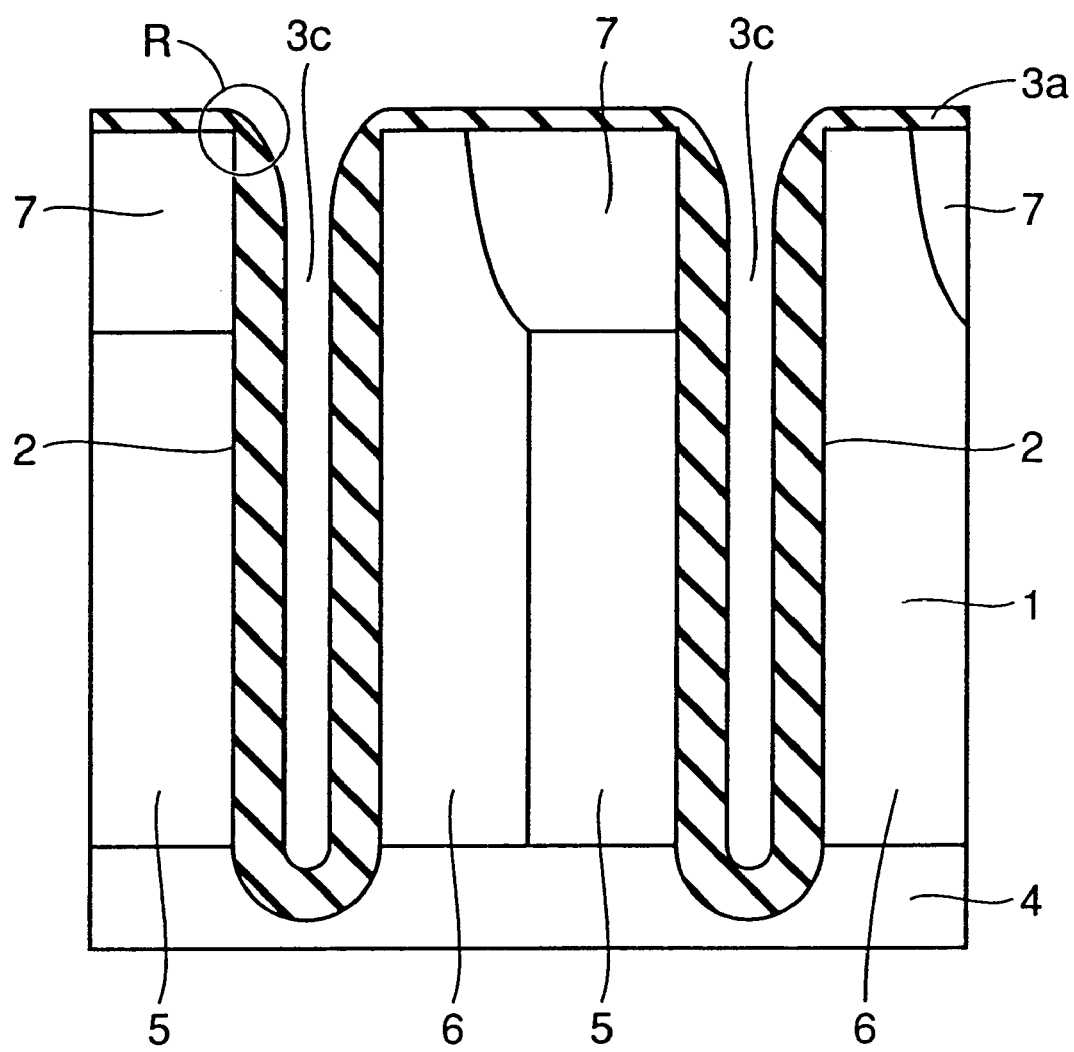

Referring to FIG. 15, anisotropic etching is applied to the entire surface. Thereby, the film thickness of the CVD oxide film 3a on the first main surface is made thinner and the voids 2a are connected to the outside so as to form the apertures 3c. And, at this stage, the upper edge corner parts R of the CVD oxide film 3a of those apertures 3c are made to be in a form having slopes spreading outward more gently than the slopes of the upper edge corner parts of the trenches 2.

Figure 16:
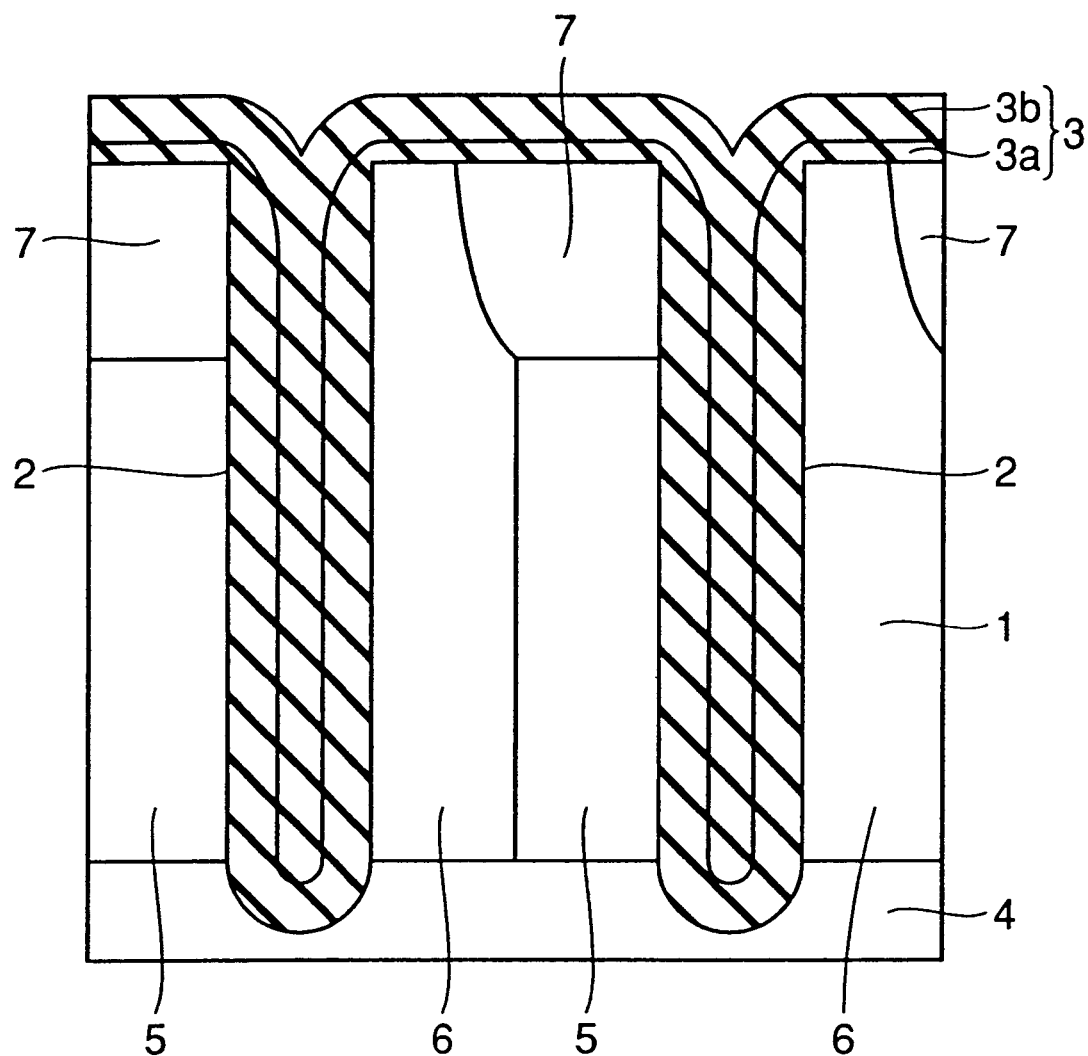

Referring to FIG. 16, the silicon oxide film 3b is formed on the entire surface through a CVD method. Thereby, the inner peripheral regions of the silicon oxide film 3a inside of the trenches 2 are filled in with the silicon oxide film 3b.

Figure 17:
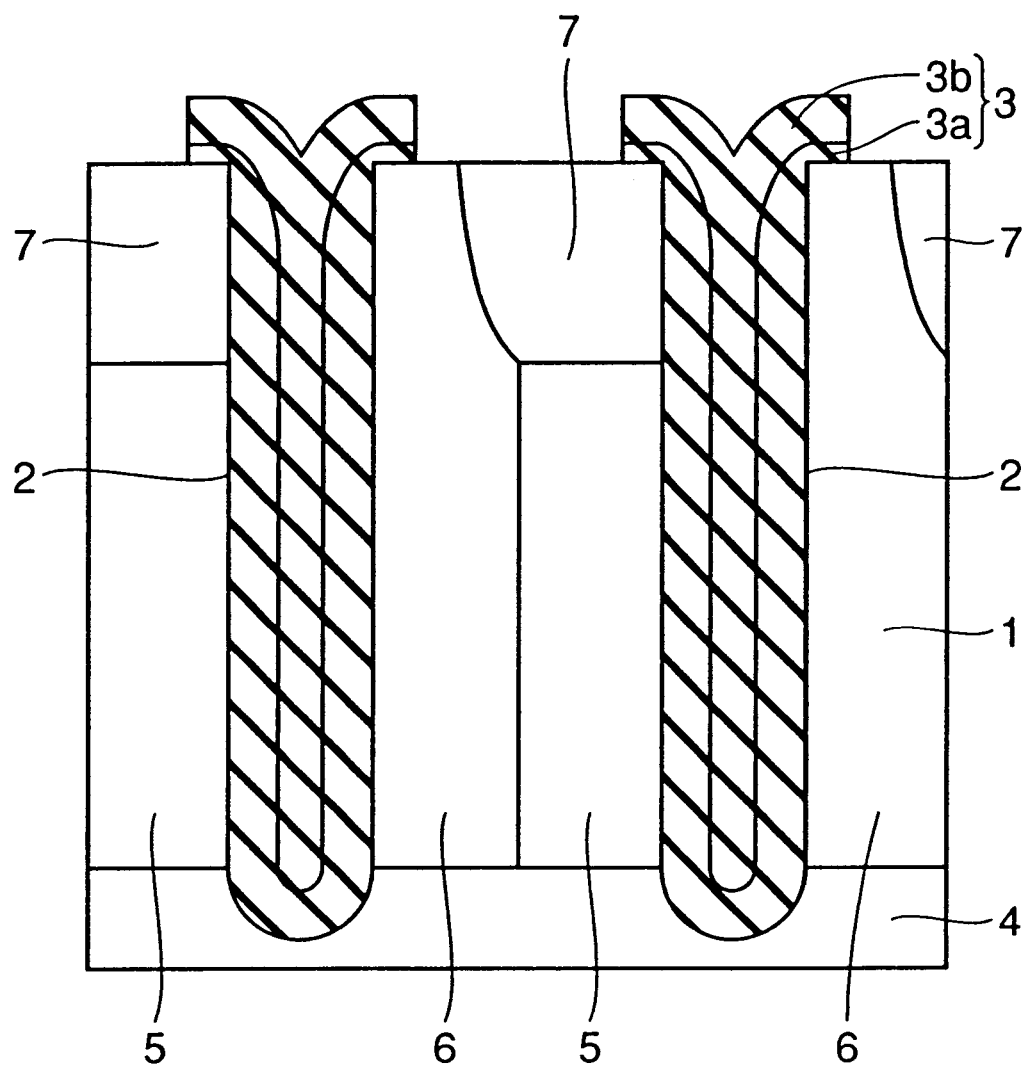
Figure 18:
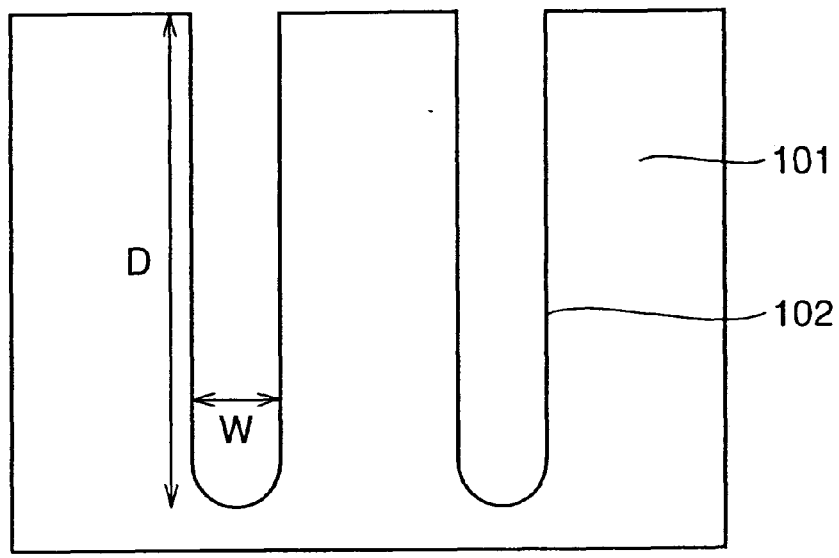
FIGS. 18 and 19 are schematic cross section views showing a process, following the steps in order, for a semiconductor device having trenches according to a prior art.
Figure 19:
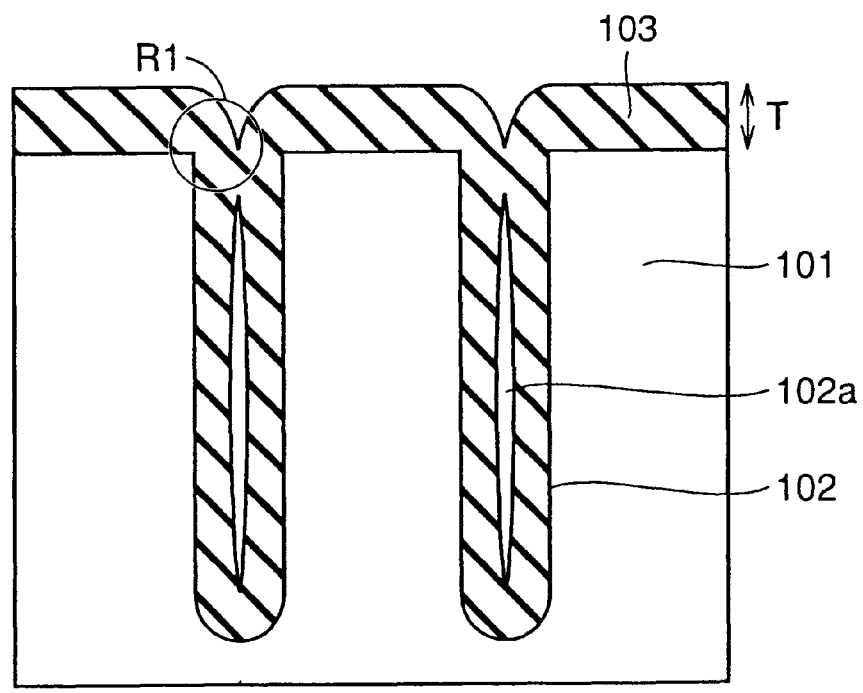

Referring to FIG. 17, the CVD oxide film 3 is patterned through a conventional photomechanical technology and etching technology. At this stage, since the film thickness of the CVD oxide film 3 remaining on the first main surface is thin, the step joining the upper surface of the CVD oxide film 3 and the first main surface of the semiconductor substrate 1 is small.

After this, the source n$^+$ diffusion regions 8, the p$^+$ diffusion regions 9, the gate insulating film 10, the gate electrode layer 11, the interlayer insulating film 12, the source electrodes 13 and the drain electrodes 14 are, respectively, formed so as to complete a semiconductor device as shown in FIG. 1.

According to the present embodiment, a semiconductor device can be gained wherein the voids inside of the trenches 2 are less and the step joining the upper surface of the CVD oxide film 3 and the first main surface is small.

Here, though the case where a silicon oxide film 21 is removed in the process of FIGS. 12 and 13 is described, the silicon oxide film 21 may not be removed and may remain or only the upper surface part may be removed so that only a predetermined film thickness remains. In addition, though the process for forming p-type diffusion regions 7 which become p-type bodies are formed before the formation of the trenches 2 is described, those p-type diffusion regions 7 may be formed after the trenches 2 are formed.

In addition, the substrate part is not limited to silicon but, rather, may be a compound semiconductor such as SiC, GaAs, SiGe and InP.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A process for a semiconductor device having a trench including:

the step of forming a trench in a main surface of a semiconductor substrate;

the step of forming a first insulating film on the main surface of said semiconductor substrate in one step, or in a plurality of divided steps, so as to fill in said trench and to have a void in said trench;

the step of forming an aperture which reaches to the inside of said trench in said first insulating film by connecting said void with the outside of said trench through an anisotropic etching in said first insulating film so that the upper edge corner parts of said aperture in said first insulating film have a more round edge than the upper edge corner parts of said trench and of reducing the film thickness of said first insulating film on the main surface of said semiconductor substrate; and the step of forming a second insulating film on the main surface of said semiconductor substrate in one step, or in a plurality of divided steps, so as to fill in said aperture.

2. The process for a semiconductor device having a trench according to claim 1, wherein said step of forming said first insulating film, said step of etching anisotropically said first insulating film and said step of forming said second insulating film are repeated, twice, or more, in this order.

3. The process for a semiconductor device having a trench according to claim 1, wherein said first and said second insulating films are any of a silicon oxide film, a silicon nitride film or a complex film of a silicon oxide film and a silicon nitride film, formed through a chemical vapor deposition method.

4. The process for a semiconductor device having a trench according to claim 3, wherein before the completion of the filling in of said trench with said first insulating film or before completion of filling in of said trench with said second insulating film, sintering treatment is carried out in order that the insulating film within said trench is made higher in density, physically or stoichiometrically, so as to reduce the stress and that the stress occurrence due to the thermal treatments in the following steps is suppressed.

5. The process for a semiconductor device having a trench according to claim 4, wherein said sintering treatment is carried out at a temperature of 800° C., or higher, and under a water vapor atmosphere, a burning oxidization atmosphere or an atmosphere of a high partial pressure of oxygen.

6. The process for a semiconductor device having a trench according to claim 4, wherein the temperature in said sintering treatment is higher than in any other temperatures in the following steps.

7. The process for a semiconductor device having a trench according to claim 1, wherein the aspect ratio of said trench is at least 10.

8. The process for a semiconductor device having a trench according to claim 1, wherein the anisotropic etching of said first insulating film incompletely removes the first insulating film from the main surface of said semiconductor substrate.

* * * * *